United States Patent [19]
Knapp et al.

[11] Patent Number: 5,468,910
[45] Date of Patent: Nov. 21, 1995

[54] SEMICONDUCTOR DEVICE PACKAGE AND METHOD OF MAKING

[75] Inventors: James H. Knapp, Chandler; Keith E. Nelson, Tempe, both of Ariz.

[73] Assignee: Motorola, Inc., Schaumburg, Ill.

[21] Appl. No.: 375,061

[22] Filed: Jan. 19, 1995

Related U.S. Application Data

[63] Continuation of Ser. No. 100,236, Aug. 2, 1993, abandoned.

[51] Int. Cl.⁶ .......................... H01L 23/28; H01L 23/12; H05K 7/20; H05K 1/18
[52] U.S. Cl. .................. 174/52.2; 264/272.17; 257/704; 361/718; 361/764; 361/783
[58] Field of Search .................. 257/704; 264/272.14, 264/272.17; 174/52.1, 52.2, 52.4; 361/718, 764, 783

[56] References Cited

U.S. PATENT DOCUMENTS

| | | |
|---|---|---|
| 3,292,050 | 12/1966 | Grossoehme . |
| 3,469,148 | 9/1969 | Lund . |
| 3,735,211 | 5/1973 | Kapnias . |
| 3,745,422 | 7/1973 | Carnes . |
| 3,874,549 | 4/1975 | Hascoe . |
| 4,114,177 | 9/1978 | King . |
| 5,108,955 | 4/1992 | Ishida .................. 437/214 |
| 5,120,678 | 6/1992 | Moore et al. .......... 437/183 |
| 5,157,478 | 10/1992 | Ueda et al. ............. 357/72 |

FOREIGN PATENT DOCUMENTS

| | | |
|---|---|---|
| 0556550 | 8/1993 | European Pat. Off. . |
| 229860 | 10/1987 | Japan .................. 257/704 |
| 01-11352 | 1/1989 | Japan .................. 257/704 |
| 3273667 | 12/1991 | Japan .................. 257/704 |
| 4127456 | 4/1992 | Japan .................. 257/704 |

Primary Examiner—Michael W. Phillips
Assistant Examiner—Stephen T. Ryan
Attorney, Agent, or Firm—William E. Koch

[57] ABSTRACT

A method for making an improved semiconductor device package is provided. A semiconductor die (16) is attached to a supportive substrate (10, 12). A protective lid (20) is attached to the supportive substrate (10, 12), over the semiconductor die (16). The protective lid (20) is partially encapsulated with molding compound (28). The protective lid (20) prevents the molding compound (30) from contacting the semiconductor die (16), and associated wirebonded wires (18). A portion (30) of the protective lid (20) remains exposed. Thus, a molded package compatible with current product designs and assembly processes is provided, yet disadvantages caused by molding compound contacting the die (16) and wires (18) are avoided. Furthermore, the exposed protective lid (30) provides superior heat dissipation for the package.

13 Claims, 2 Drawing Sheets

SEMICONDUCTOR DEVICE PACKAGE AND METHOD OF MAKING

This application is a continuation of prior application Ser. No. 08/100,236, filed Aug. 2, 1993, now abandoned.

BACKGROUND OF THE INVENTION

The present invention relates to semiconductor devices, and more particularly, to semiconductor device packages comprising molded compounds.

Conventionally, many semiconductor devices are packaged by being encapsulated in molding compounds. A compound typically used in the industry comprises novalac epoxy.

More specifically, the typical conventional semiconductor device package comprises a supporting substrate on which a semiconductor die is mounted. The substrate may comprise a printed wire board, heatsink, leadframe, or the like, or integral combinations thereof. Electrical connections are typically made to the die via wire bonding. Conventionally, the supporting substrate, die and wire bonds are subsequently completely encapsulated with molding compound. Typically, leads extend from the compound for making electrical connections to the device. Alternately, conductive bumps may provide electrical connections to the semiconductor die.

The conventional packaging technique, including the complete encapsulation of the wires and semiconductor die in molding compound, gives rise to a number of significant disadvantages. For example, during the molding process, the molding compound contacts the wire bonded wires. The wires are subject to being pushed toward one another, causing shorts. Additionally, the wire bonds may be broken as the molding compound moves through the wires. To avoid this, conventional molding processes must go to great lengths to make the molding compound extremely viscous, thus minimizing disturbing the wires. Furthermore, special, extremely expensive, molding compounds are used to obtain the required viscosity.

An additional disadvantage occurring in conventional packaging processes is delamination of the molding compound from the semiconductor die. Ideally, the molding compound completely encapsulates the die, and remains in contact with the die throughout the life of the device. In practice, however, separation of the molding compound from the die may occur due to the difference in temperature characteristics such as coefficients of expansion, between the die and the compound. Conventionally, this problem is solved in part by employing extremely expensive molding compounds whose temperature characteristics are similar to the semiconductor die and other materials encapsulated. This problem is exaggerated as die size increases.

A related problem is that mold compound on the die surface can lead to stress related failure of the device. For example, the stress can cause metal movement on the surface of the die. Also, the stress at the compound/die interface and the difference in compound verses air dielectric properties can detrimentally effect electrical performance.

An additional disadvantage experienced with conventional packaging techniques is characterized as the popcorn phenomenon. During the molding process, small voids are formed deep within the device package. The voids can trap moisture. When the devices are incorporated into manufactured products, their temperature is typically raised substantially to flow solder. At the high temperatures, the moisture trapped in the voids turns to steam, thereby exploding the part. Conventional solutions to this problem include employing strict molding process parameters, expensive molding compounds, and extensive curing and dry packing the devices. Each of these solutions significantly raises the cost of the semiconductor device and has a negative impact on yield.

Further limitations of conventional packaging techniques include limitations on the number of semiconductor die which may be encapsulated to form a single packaged device, as well as the complexity of the die and wire layout within the molding compound.

Despite the discussed disadvantages, it is never the less extremely desirable to provide a semiconductor package which is essentially a molded package. This is because the molded package is rugged and fairly cost effective. Additionally, the industry is accustom to the molded package in that product designs and assembly processes are set up to use molded packages. Accordingly, what is needed is a device packaging technique which provides a molded package, yet eliminates the disadvantages brought about by conventional packaging.

Specifically, it would be desirable to provide a technique wherein the molding compound does not contact the wire bonded wires and semiconductor die during processing. This would eliminate the potential for wires shorting together or becoming detached. It would additionally be desirable if the molding compound was not in contact with the semiconductor die during the life of the device. This would eliminate the potential for separation between molding compound and semiconductor die. This would also eliminate the stress related problems resulting from compound covering the die. Furthermore, it would be desirable if molding compound was provided only near the perimeter of the complete device. This would significantly reduce the concern for voids and the popcorn condition.

SUMMARY OF THE INVENTION

Briefly stated, the present invention provides a method for making a semiconductor device package which is molded but does not have the disadvantages common to the conventional packaging techniques. A method is provided which includes providing a semiconductor die. The semiconductor die is attached to a supportive substrate. The semiconductor die is covered with a protective lid. Additionally, the protective lid is partially encapsulated with molding compound such that a portion of the protective lid remains exposed.

DETAILED DESCRIPTION OF THE DRAWINGS

Generally, the method of the present invention is capable of providing a molded semiconductor device package which lacks the significant disadvantages associated with conventional packaging techniques. The preferred device made in accordance with the present invention can be substituted for the conventionally packaged device without modifications to the design of the manufactured equipment in which the device is incorporated. In fact, the preferred device made in accordance with the method of the present invention looks and behaves just like the conventional semiconductor device package, but is not susceptible to many of the problems associated with conventional molding processes. Additionally, the preferred device has superior heat dissipating capabilities because the semiconductor die is not encapsulated by molding material.

Figure 1:
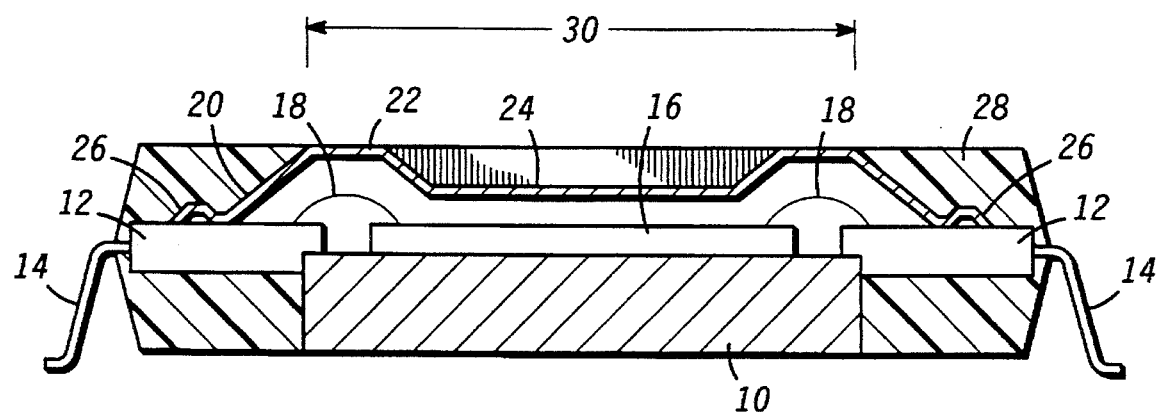
FIG. 1 is a cross-section of the preferred semiconductor device package made in accordance with the method of the present invention.

Turning to the figures for illustration, FIG. 1 is a cross-section of the preferred semiconductor device package made in accordance with the method of the present invention. The device shown in FIG. 1 comprises heatsink 10. Printed wire board 12 is attached to heatsink 10. It will be understood that printed wire board 12 completely surrounds heatsink 10. Electrical leads 14 are distributed about printed wire board 12. The electrical leads 14 provide electrical connection to external devices. Printed wire board 12 in combination with heatsink 10 provide a supportive substrate.

Semiconductor die 16 is attached to heatsink 10. Semiconductor die 16 may comprise a single electronic device, a monolithic integrated circuit, or the like. Semiconductor die 16 is electrically connected to printed wire board 12 via a plurality of wire bonded wires represented by wires 18. Wire bonded wires 18 have a curved shape, as shown, resulting from conventional wire bonding techniques.

According to the method of the present invention, wire bonding wires 18 and semiconductor die 16 are covered by protective lid 20. Protective lid 20 comprises raised portion 22 which is shaped to conform to the shape of the plurality of wires 18. Thus, raised portion 22 causes protective lid 20 to avoid the wires 18. Additionally, protective lid 20 comprises lowered portion 24. Lowered portion 24 is disposed as close as reasonably possible to semiconductor die 16, in a plane parallel to the plane defined by the semiconductor die 16. Lowered portion 24 is disposed as close as possible to semiconductor die 16 to provide enhanced heat dissipation.

It will be understood that semiconductor die 16 heats significantly during operation. In the embodiment shown in FIG. 1, heat is radiated from semiconductor die 16 to lowered portion 24 of protective lid 20. The heat is then distributed throughout protective lid 20 and dissipated.

Protective lid 20 preferably comprises laminated layers of iron and aluminum as disclosed in detail in co-pending U.S. patent application Ser. No. 08/051,954, filed Apr. 26, 1993, which is incorporated herein by reference. As explained in detail in the co-pending application, the material composing protective lid 20 is designed to have thermal characteristics consistent with the semiconductor die and supportive substrate components covered by protective lid 20. Additionally, the material for lid 20 is chosen to optimize certain electrical parameters, depending upon the particular application.

More specifically, the selection of the material for lid 20 is a function of the desired parameter to be optimized. For example, a suitable material for digital circuit applications, in which it is desired to optimize lead inductance and the resonant frequency, is a bi-metal laminated cap comprising a layer of iron and a layer of aluminum. Preferably the iron layer has a thickness of approximately 150 micrometers and the aluminum layer has a thickness of approximately 450 micrometers. The iron side of the bi-metal structure faces the semiconductor die. On the other hand, in analog applications operating at greater than one gigahertz it is desirable to optimize impedance matching. Although the aforementioned material is suitable for analog applications, optimization is achieved by placing protective lid 20 such that the aluminum side faces semiconductor die 16. A protective lid 20 comprising copper is also suitable for the analog applications. Moreover, in cases wherein matching of coefficients of thermal expansion is desirable, the bi-metal protective lid provides desirable results.

Protective lid 20 further comprises locking portion 26. Locking portion 26 is a locking feature which provides surface area for contacting encapsulating molding compound 28 as well as the supportive substrate, in this case printed wire board 12. The preferred locking portion 26 has a height from printed wire board 12 of approximately 1.5 times the thickness of the metal sheet used for the lid. This ratio provides desirable locking with the encapsulating molding compound.

Protective lid 20 is attached to the supportive substrate with a conformal adhesive. The adhesive may be applied according to a variety of well known methods, including application in liquid form, tape, or molded solid.

Locking feature 26 interfaces molding compound 28 and extends into the molding material. Molding compound 28 comprises novalac epoxy which is well known to be a common molding material. An important and advantageous aspect of the present invention is that molding compound 28 only partially encapsulates protective lid 20. The portion of protective lid 20 indicated by the line 30 remains exposed. The exposed portion permits the heat generated by semiconductor die 16 to be efficiently radiated from the package. Thus, the preferred device provides superior heat radiation, compared to the conventionally molded device where molding compound completely encapsulates the top surface of the semiconductor die and traps the heat generated. It is significant to note that the majority of the heat generated by a semiconductor die is at its top surface. The device made according to the method of the present invention places a heat radiator, lid 20, near the top surface. The conventional package, on the other hand, relies on a heat sink attached to the bottom of the die for dissipating heat. Thus, in the conventional package, heat must pass through the entire thickness of the semiconductor die.

FIG. 1, along with the foregoing description, presents a molded package wherein the semiconductor die and wire bonded wires are protected from the molding compound. Since molding compound will not be passing through wires 18 and contacting semiconductor die 16, many of the significant molding process parameters become extremely relaxed. The compound does not need to be nearly as viscous for avoiding damaging wires 18. Additionally, the compound does not need to be closely matched, thermally, to semiconductor die 16. Furthermore, molded voids, which trap moisture, do not have nearly as a significant impact on yield. Consequently, where in the conventional packaging techniques extremely expensive molding compound and extremely tight process parameters are required, according to the method of the present invention, much less expensive compounds and a broader range of process parameters are possible. For example, where a conventional device may be molded at 500 psi with a compound costing $7.50 per pound, a device made in accordance with the method of the present invention may be molded at 50 psi with compounds costing as little as 0.30 per pound. It will be understood by those skilled in the art that compounds and process parameters may be varied, while staying within the scope of the method of the present invention, depending on the particular application.

An additional advantage resulting from the method of the present invention is the elimination of the need for extensive post-mold curing and dry packing processes. Since molded material 28 does not contact the majority of the device, including semiconductor die 16 and wires 18, the extent of polymer crosslinking, enhanced by curing, is not nearly as important. Additionally, since there is much less molded material, and since the molded material does not reside near active portions of the device, voids and popcorn conditions do not have as strong an impact on yield. An additional advantage provided by the device made in accordance with the method of the present invention is enhanced electromagnetic interference shielding. Since protective lid 20 comprises metal, it prevents electromagnetic fields from entering and leaving the cavity formed between lid 20 and die 16, through lid 20. Shielding is further enhanced if lid 20 is coupled to the electrical ground of the device.

Figure 2:
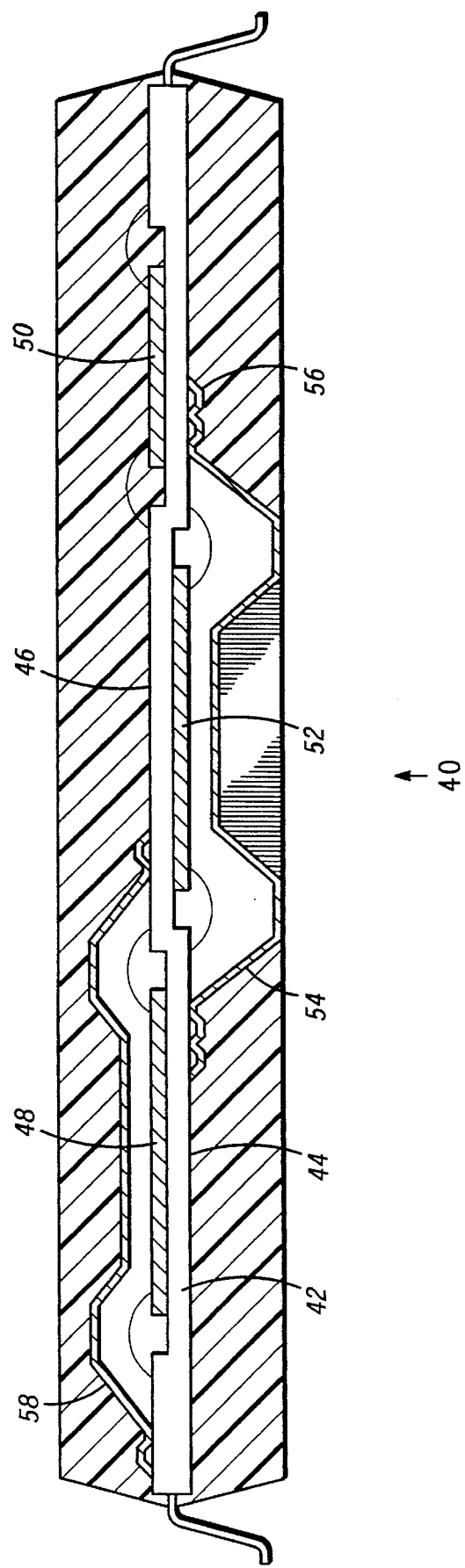
FIG. 2 is a cross-section of a first alternate semiconductor device package made in accordance with the method of the present invention.

FIG. 2 illustrates an alternate device made in accordance with the method of the present invention. FIG. 2 comprises multi-chip device 40. The device of FIG. 2 illustrates that the method of the present invention may be employed to make very complicated multi-die devices having complex layouts. More specifically, device 40 comprises supportive substrate 42. Supportive substrate 42 comprises a printed wire board which may interconnect the various die of device 40. Supportive substrate 42 comprises first surface 44 and second surface 46. Semiconductor die 48 and 50 are attached to second surface 46. Die 52 is attached to first surface 44. Protective lid 54 covers semiconductor die 52. Protective lid 54 is attached to first surface 44 in the same manner as protective lid 20 is attached to printed wire board 12 shown in FIG. 1. Protective lid 54 further comprises locking portion 56. Locking portion 56 is similar to locking portion 26 shown in FIG. 1, but comprises two locking ribs for added contact to the molded material. Protective lid 54 with locking portion 56 illustrates that a variety of lid configurations and locking portions may be used in accordance with the method of the present invention.

Semiconductor die 48 is covered by protective lid 58. Protective lid 58 is entirely encapsulated, according to this alternative embodiment. An entirely encapsulated protective lid may be used where heat dissipation from semiconductor 48 is not a particular concern. In addition, semiconductor die 50 has no protective lid at all. No lid may be used in the case of very small semiconductor die having very few wire bonded wires, for example.

Device 40 shown in FIG. 2 illustrates that the configuration of the overall device, and protective lids for respective die, will be dictated by the particular characteristics of the respective die (e.g. size, heat, electrical complexity) in conjunction with cost effectiveness analysis. Although not shown, a single protective lid may cover more than one die.

Figure 3:
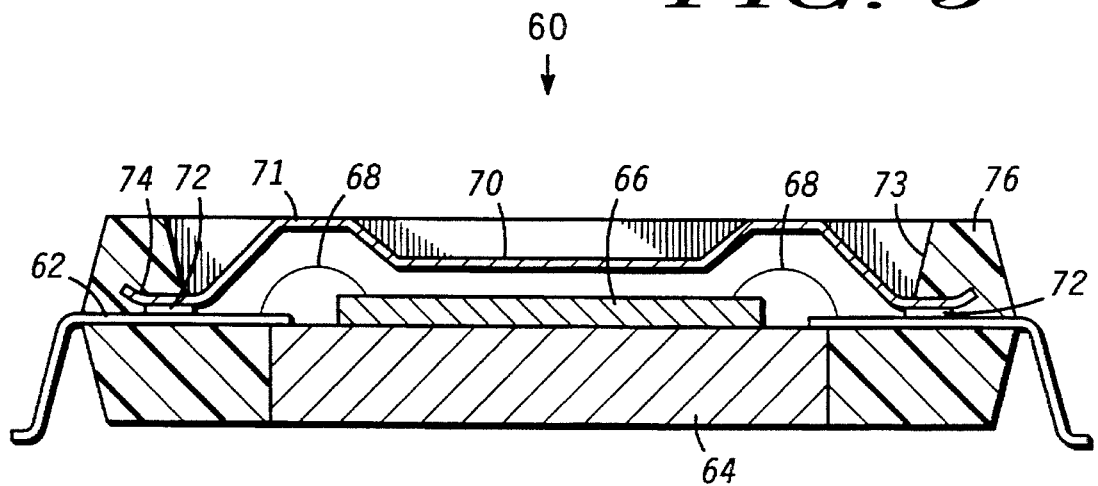
FIG. 3 is a cross-section of a second alternate semiconductor device package made in accordance with the method of the present invention.

FIG. 3 illustrates a second alternate device made in accordance with the present invention. FIG. 3 illustrates device 60. Device 60 differs from the previously described devices in several notable respects. Device 60 comprises metal leadframe 62. Metal leadframe 62 is contrasted with the printed wire boards of the previously described devices. Metal leadframe 62 insulatingly attaches to heatsink 64. Together, metal leadframe 62 and heatsink 64 provide a supportive substrate.

Semiconductor die 66 is attached to heatsink 64. Semiconductor die 66 is electrically coupled to respective leads of leadframe 62 via wire bonded wires 68. Protective lid 70 covers wires 68 and semiconductor die 66. Protective lid 70 is attached to leadframe 62 with molded adhesive 72. It will be understood that molded epoxy 72 is electrically insulating.

Protective lid 70 further comprises locking portion 74. Locking portion 74 merely comprises an upturned corner to provide locking to the molded compound and rigidity to the protective lid.

Device 60 further comprises molded material 76. Molded material 76 extends over locking portion 74, but not all the way to raised portion 71 of lid 70. Rather, the extent of material 76 stops at edge 73. This configuration may be preferable where the molding pressure on raised portion 71 is to be minimized.

By now it should be realized that a method for forming an improved semiconductor device package is provided. The method is capable of providing a molded device, compatible with present product and assembly processes, which does not suffer from many significant disadvantages associated with conventional molding techniques. Additionally, the method of the present invention provides a device with thermal dissipation superior to conventional molded packages due to the exposed radiating cap positioned over the top of the semiconductor die.

We claim:

1. A method for making a semiconductor device package, comprising the steps of:

providing a supportive substrate comprising a printed wire board, the printed wire board comprising a plurality of edges and a plurality of exterior electrical leads extending laterally from the plurality of edges;

attaching a first semiconductor die to a first surface of the supportive substrate;

electrically connecting the semiconductor die to the printed wire board with a plurality of wires;

covering the plurality of wires and the first semiconductor die with a first protective lid of a uniform thickness having a raised portion shaped to conform to the plurality of wires and having a lowered portion overlying the first semiconductor die and parallel to the first semiconductor die, the first protective lid attached to the first surface of the supportive substrate thereby sealing the semiconductor die and the plurality of wires; and partially encapsulating the first protective lid and a portion of the electrical leads with a molding compound such that a portion of the first protective lid overlying the semiconductor die remains exposed.

2. The method of claim 1, wherein the step of covering the plurality of wires and first semiconductor die further comprises the first protective lid having a locking portion and wherein the step of encapsulating comprises encapsulating the locking portion of the protective lid.

3. The method of claim 1, wherein the step of covering further comprises providing a structure comprising iron and aluminum as the first protective lid.

4. The method of claim 1, further comprising the steps of, attaching a second semiconductor die to a second surface of the supportive substrate, and covering the second semiconductor die with a second protective lid.

5. The method of claim 4, further comprising the step of partly encapsulating the second protective lid.

6. The method of claim 4, further comprising the step of completely encapsulating the second protective lid.

7. A method for making a semiconductor device package comprising the steps of:

providing a semiconductor die;

attaching the semiconductor die to a supportive substrate comprising a plurality of edges and a plurality of exterior leads extending laterally from the plurality of edges;

covering the semiconductor die with a protective lid of a uniform thickness, the protective lid including a locking portion and a lowered portion overlying the semiconductor die, the lowered portion being lower than a raised portion overlying a plurality of wire bond wires electrically connecting the semiconductor die to the exterior leads; and partly encapsulating the protective lid and a portion of the leads with a molding compound such that a portion of the protective lid overlying the semiconductor die remains exposed, thereby sealing the semiconductor die.

8. The method of claim 7, wherein the step of attaching the semiconductor die comprises providing a printed wire board as part of the supportive substrate.

9. The method of claim 7, wherein the step of covering comprises providing a structure comprising iron and aluminum as the protective lid.

10. A semiconductor device package comprising:

a supportive substrate comprising a plurality of edges and a plurality of exterior leads extending laterally from the plurality of edges;

a semiconductor die attached to a first surface of the supportive substrate and electrically connected, with a plurality of wire bonds, to the plurality of leads;

a protective lid of a uniform thickness covering the semiconductor die, the protective lid having a raised portion shaped to conform to the wire bonds and having a lowered portion overlying the semiconductor die parallel to the semiconductor die, the protective lid attached to the first surface thereby sealing the semiconductor die and the plurality of wires; and molded material partially encapsulating the protective lid and a portion of the leads, a portion of the protective lid overlying the semiconductor die remaining exposed.

11. The package of claim 10, wherein the protective lid comprises a locking feature extending into the molded material.

12. The package of claim 10, wherein the supportive substrate comprises a leadframe.

13. The package of claim 10, wherein the supportive substrate comprises a printed wire board.

* * * * *